(12) United States Patent
Takahashi et al.

(10) Patent No.: US 11,239,093 B2
(45) Date of Patent: Feb. 1, 2022

(54) METHOD FOR TREATING SUBSTRATE, METHOD FOR MANUFACTURING SEMICONDUCTOR DEVICE, AND KIT FOR TREATING SUBSTRATE

(71) Applicant: FUJIFILM Corporation, Tokyo (JP)

(72) Inventors: Tomonori Takahashi, Haibara-gun (JP); Nobuaki Sugimura, Haibara-gun (JP); Hiroyuki Seki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/939,163

(22) Filed: Jul. 27, 2020

(65) Prior Publication Data

US 2020/0357657 A1  Nov. 12, 2020

Related U.S. Application Data

(63) Continuation of application No. PCT/JP2019/001575, filed on Jan. 21, 2019.

(30) Foreign Application Priority Data

Feb. 5, 2018 (JP) .............................. JP2018-018290

(51) Int. Cl.
*H01L 21/321* (2006.01)
*H01L 21/3213* (2006.01)
(Continued)

(52) U.S. Cl.
CPC ........ *H01L 21/32134* (2013.01); *C09K 13/04* (2013.01); *C09K 13/12* (2013.01); *H01L 21/02068* (2013.01)

(58) Field of Classification Search
None
See application file for complete search history.

(56) References Cited

U.S. PATENT DOCUMENTS

| | | | |
|---|---|---|---|
| 6,143,192 A * | 11/2000 | Westmoreland | .......... C23F 1/30 |
| | | | 216/101 |
| 2001/0023701 A1 | 9/2001 | Aoki et al. | |
| 2011/0140181 A1 | 6/2011 | Afzali-Ardakani et al. | |

FOREIGN PATENT DOCUMENTS

| | | |
|---|---|---|
| JP | 2000-260746 A | 9/2000 |
| JP | 2001-234373 A | 8/2001 |

(Continued)

OTHER PUBLICATIONS

International Search Report dated Feb. 12, 2019 in International Application No. PCT/JP2019/001575.

(Continued)

*Primary Examiner* — Roberts P Culbert
(74) *Attorney, Agent, or Firm* — Sughrue Mion, PLLC

(57) ABSTRACT

The present invention provides a method for treating a substrate, which can remove transition metal-containing substances on a substrate with high efficiency while inhibiting cerium from remaining on the surface of the treated substrate. Furthermore, the present invention provides a method for manufacturing a semiconductor device including the method for treating a substrate, and a kit for treating a substrate that is applicable to the method for treating a substrate. The method for treating a substrate according to an embodiment of the present invention includes a step A of removing a transition metal-containing substance on a substrate by using a chemical solution, which includes a cerium compound and one or more pH adjusters selected from the group consisting of nitric acid, perchloric acid, ammonia, and sulfuric acid, for the substrate having the transition metal-containing substance, and a step B of performing a rinsing treatment on the substrate obtained by the step A by using one or more rinsing solutions selected from the group consisting of a solution including hydrogen peroxide and an acidic aqueous solution which is other than hydrofluoric (Continued)

acid, nitric acid, an aqueous perchloric acid solution, an aqueous oxalic acid solution, and a mixed aqueous solution of these and does not include hydrogen peroxide after the step A.

22 Claims, 2 Drawing Sheets

(51) Int. Cl.
    *C09K 13/04*     (2006.01)
    *C09K 13/12*     (2006.01)
    *H01L 21/02*     (2006.01)

(56) References Cited

FOREIGN PATENT DOCUMENTS

| | | |
|---|---|---|
| JP | 2007-321186 A | 12/2007 |
| JP | 4510979 B2 | 7/2010 |
| JP | 2013-513824 A | 4/2013 |

OTHER PUBLICATIONS

Written Opinion of the International Searching Authority dated Feb. 12, 2019 in International Application No. PCT/JP2019/001575.
International Preliminary Report on Patentability dated Aug. 11, 2020 in International Application No. PCT/JP2019/001575.
Office Action dated Sep. 21, 2021 from the Japanese Patent Office in JP Application No. 2019-569007.

\* cited by examiner

METHOD FOR TREATING SUBSTRATE, METHOD FOR MANUFACTURING SEMICONDUCTOR DEVICE, AND KIT FOR TREATING SUBSTRATE

CROSS-REFERENCE TO RELATED APPLICATIONS

This application is a Continuation of PCT International Application No. PCT/JP2019/001575 filed on Jan. 21, 2019, which claims priority under 35 U.S.C. § 119(a) to Japanese Patent Application No. 2018-018290 filed on Feb. 5, 2018. The above application is hereby expressly incorporated by reference, in its entirety, into the present application.

BACKGROUND OF THE INVENTION

1. Field of the Invention

The present invention relates to a method for treating a substrate, a method for manufacturing a semiconductor device, and a kit for treating a substrate.

2. Description of the Related Art

As the miniaturization of semiconductor products progresses, there is an increasing demand for performing a step of removing unnecessary transition metal-containing substances on a substrate in a semiconductor device manufacturing process with high efficiency.

JP4510979B discloses "method of using a remover of ruthenium or ruthenium oxide, including removal of ruthenium or ruthenium oxide attached to a silicon substrate by using a remover containing (a) ammonium cerium (IV) nitrate and (b) one acid or two or more acids selected from the group consisting of nitric acid, perchloric acid, and acetic acid, in which a content of (a) component is 5% to 35% by mass, and a content of (b) component is 1% to 30% by mass (claim 1)".

SUMMARY OF THE INVENTION

In recent years, it has been pointed out that impurities present on a substrate adversely affect the performance of a semiconductor device manufactured using the substrate, and thus the amount of impurities present on the surface of the substrate has been required to be reduced.

The inventors of the present invention examined the treatment of removing transition metal-containing substances by using the method disclosed in JP4510979B. As a result, it has been confirmed that the amount of cerium remaining as impurities on the surface of the treated substrate tends to be too large.

Therefore, an object of the present invention is to provide a method for treating a substrate, which can remove transition metal-containing substances on a substrate with high efficiency while inhibiting cerium from remaining on the surface of the treated substrate.

Another object of the present invention is to provide a method for manufacturing a semiconductor device including the method for treating a substrate, and a kit for treating a substrate that is applicable to the method for treating a substrate.

In order to achieve the above objects, the inventors of the present invention conducted intensive examinations. As a result, the inventors have found that the objects can be achieved by a method having a step A of removing a transition metal-containing substance on a substrate by using a chemical solution including a cerium compound and the like and a step B of performing a rinsing treatment on the substrate by using a specific rinsing solution, and have accomplished the present invention.

That is, the inventors have found that the above objects can be achieved by the following constitution.

[1] A method for treating a substrate, including
a step A of removing a transition metal-containing substance on a substrate by using a chemical solution, which includes a cerium compound and one or more pH adjusters selected from the group consisting of nitric acid, perchloric acid, ammonia, and sulfuric acid,
for the substrate having the transition metal-containing substance, and
a step B of performing a rinsing treatment on the substrate obtained by the step A by using one or more rinsing solutions selected from the group consisting of a solution including hydrogen peroxide and an acidic aqueous solution which is other than hydrofluoric acid, nitric acid, an aqueous perchloric acid solution, an aqueous oxalic acid solution, and a mixed aqueous solution of these and does not include hydrogen peroxide.

[2] The method for treating a substrate described in [1], in which the cerium compound is one or more kinds of compounds selected from the group consisting of cerium nitrate salts and cerium sulfate salts.

[3] The method for treating a substrate described in [1] or [2], in which the cerium compound is one or more kinds of compounds selected from the group consisting of ammonium cerium (IV) nitrate and ammonium cerium (IV) sulfate.

[4] The method for treating a substrate described in any one of [1] to [3], in which the cerium compound is ammonium cerium (IV) nitrate.

[5] The method for treating a substrate described in any one of [1] to [4], in which the solution including hydrogen peroxide is a solution selected from the group consisting of aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, and a mixed solution of hydrochloric acid and aqueous hydrogen peroxide.

[6] The method for treating a substrate described in any one of [1] to [5], in which the acidic aqueous solution, which is other than hydrofluoric acid, nitric acid, an aqueous perchloric acid solution, an aqueous oxalic acid solution, and a mixed aqueous solution of these and does not include hydrogen peroxide, is an acidic aqueous solution selected from the group consisting of sulfuric acid, phosphoric acid, aqueous carbon dioxide, aqueous ozone, aqueous hydrogen, an aqueous citric acid solution, an aqueous periodic acid solution, an aqueous hypochlorous acid solution, and aqua regia.

[7] The method for treating a substrate described in any one of [1] to [6], in which a pH of the chemical solution is −1.0 to 4.0.

[8] The method for treating a substrate described in any one of [1] to [7], in which a content of the cerium compound is equal to or greater than 5% by mass with respect to a total mass of the chemical solution.

[9] The method for treating a substrate described in any one of [1] to [8], in which a content of the cerium compound is equal to or smaller than 30% by mass with respect to a total mass of the chemical solution.

[10] The method for treating a substrate described in any one of [1] to [9], in which the pH adjuster includes nitric acid.

[11] The method for treating a substrate described in [10], in which a content of the nitric acid is equal to or greater than 1% by mass with respect to a total mass of the chemical solution.

[12] The method for treating a substrate described in [10] or [11], in which a content of the nitric acid is equal to or smaller than 30% by mass with respect to a total mass of the chemical solution.

[13] The method for treating a substrate described in any one of [1] to [12], in which a temperature of the chemical solution is equal to or higher than 35° C.

[14] The method for treating a substrate described in any one of [1] to [13], in which a temperature of the chemical solution is equal to or lower than 60° C.

[15] The method for treating a substrate described in any one of [1] to [14], in which the rinsing solution is a mixed solution of sulfuric acid and aqueous hydrogen peroxide that has a temperature of 90 to 250° C., or one or more solutions that are selected from the group consisting of the solution including hydrogen peroxide other than the mixed solution of sulfuric acid and aqueous hydrogen peroxide and the acidic aqueous solution and have a temperature of 15° C. to 70° C.

[16] The method for treating a substrate described in any one of [1] to [15], in which the transition metal-containing substance includes at least one kind of metal selected from the group consisting of Ru, Ti, Ta, Co, Cr, Hf, Os, Pt, Ni, Mn, Cu, Zr, Mo, La, W, and Ir.

[17] The method for treating a substrate described in [16], in which the transition metal-containing substance includes a Ru-containing substance.

[18] The method for treating a substrate described in any one of [1] to [17], in which the step A is a step A1 of performing a recess etching treatment on transition metal-containing wiring disposed on a substrate by using the chemical solution, a step A2 of removing a transition metal-containing film at an outer edge portion of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, or a step A5 of removing a transition metal-containing substance on a substrate, which has undergone a chemical mechanical polishing treatment, by using the chemical solution.

[19] The method for treating a substrate described in [18] that has the step A1 as the step A, further including:

a step Ab of treating the substrate obtained by the step A1 by using a solution selected from the group consisting of a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, and a mixed solution of hydrochloric acid and aqueous hydrogen peroxide after the step A1.

[20] The method for treating a substrate described in [19], in which the step A1 and the step Ab are alternately repeated.

[21] A method for manufacturing a semiconductor device, including the method for treating a substrate described in any one of [1] to [20].

[22] A kit for treating a substrate, including a chemical solution including ammonium cerium (IV) nitrate and one or more pH adjusters selected from the group consisting of nitric acid, perchloric acid, ammonia, and sulfuric acid, and one or more rinsing solutions selected from the group consisting of a solution including hydrogen peroxide and an acidic aqueous solution which is other than hydrofluoric acid, nitric acid, an aqueous perchloric acid solution, an aqueous oxalic acid solution, and a mixed aqueous solution of these and does not include hydrogen peroxide.

According to the present invention, it is possible to provide a method for treating a substrate, which can remove transition metal-containing substances on a substrate with high efficiency while inhibiting cerium from remaining on the surface of the treated substrate.

Furthermore, according to the present invention, it is possible to provide a method for manufacturing a semiconductor device including the method for treating a substrate, and a kit for treating a substrate that is applicable to the method for treating a substrate.

DESCRIPTION OF THE PREFERRED EMBODIMENTS

Figure 1:
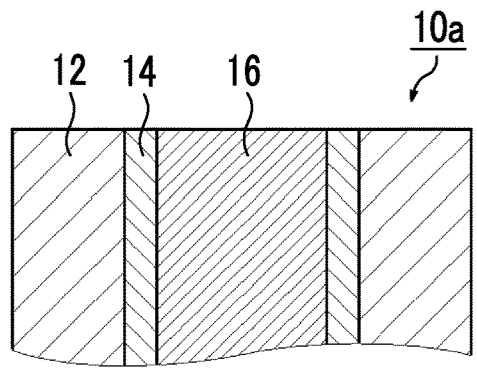
FIG. 1 is a schematic cross-sectional top view showing an example of an object to be treated used in a step A1.

Hereinafter, the present invention will be specifically described.

The following constituents will be described based on typical embodiments of the present invention in some cases, but the present invention is not limited to the embodiments.

In the present specification, unless otherwise specified, "exposure" includes not only the exposure using a mercury lamp, far ultraviolet rays represented by an excimer laser, X-rays, and Extreme Ultraviolet (EUV) light, but also lithography by particle beams such as electron beams and ion beams.

In the present specification, a range of numerical values described using "to" means a range including numerical values described before and after "to" as a lower limit and an upper limit.

In the present specification, pH is a value measured at room temperature (25° C.) by using a pH meter (HI. 99131N (product number), Hanna Instruments JAPAN).

In the present specification, a dry etching residue is a by-product generated as a result of performing dry etching (for example, plasma etching). For example, the dry etching residue refers to an organic residue derived from a photoresist, a Si-containing residue, a metal-containing residue (for example, a transition metal-containing residue), and the like.

Method for Treating Substrate

The method for treating a substrate according to an embodiment of the present invention (hereinafter, also simply referred to as "method according to the embodiment of the present invention") includes a step A and a step B.

The step A is a step of removing a transition metal-containing substance on a substrate by using a chemical solution including a cerium compound and a pH adjuster for the substrate having the transition metal-containing substance.

The pH adjuster is one or more compounds selected from the group consisting of nitric acid, perchloric acid, ammonia, and sulfuric acid.

The step B is a step of performing a rinsing treatment on the substrate obtained by the step A by using a rinsing solution after the step A.

The rinsing solution is one or more solutions selected from the group consisting of a solution including hydrogen peroxide and an acidic aqueous solution.

Here, the acidic aqueous solution is none of hydrofluoric acid, nitric acid, an aqueous perchloric acid solution, an aqueous oxalic acid solution, and a mixed aqueous solution of these. Furthermore, the acidic aqueous solution does not include hydrogen peroxide.

The chemical solution including a cerium compound and a predetermined pH adjuster can remove transition metal-containing substances on a substrate with high efficiency. However, the chemical solution tends to leave cerium on the surface of the substrate, and the cerium remaining on the substrate is difficult to remove. The inventors of the present invention have found that in a case where a predetermined rinsing solution described above is used, the cerium remaining on the surface of the substrate can be easily removed. The mechanism is unclear. However, according to the inventors of the present invention, presumably, the components included in the predetermined rinsing solution and the cerium present on the surface of the substrate could form a salt having high solubility in the rinsing solution, and thus the cerium may be easily removed.

Step A

The step A included in the method according to the embodiment of the present invention is a step of removing a transition metal-containing substance on a substrate by using a chemical solution for the substrate having the transition metal-containing substance.

Chemical Solution

Cerium Compound

The chemical solution according to the method of an embodiment of the present invention includes a cerium compound.

The cerium compound is a compound including cerium.

The cerium compound is preferably soluble in water. The water-soluble cerium compound mentioned herein means, for example, a cerium compound that can be dissolved in an amount equal to or greater than 50 g in 1 L (25° C.) of pure water (pH 7.0). Even though the amount of the cerium compound dissolved in 1 L (25° C.) of pure water is not equal to or greater than 50 g, it is preferable that the cerium compound can be dissolved in an amount equal to or greater than 50 g in 1 L (25° C.) of water including a pH adjuster which will be described later.

Examples of the cerium compound include cerium nitrate salts (such as ammonium cerium (IV) nitrate and cerium (III) nitrate), cerium sulfate salts (such as ammonium cerium (IV) sulfate, cerium (III) sulfate, and cerium (IV) sulfate), cerium oxide, and cerium hydroxide. Furthermore, these compounds may be hydrates.

Among these, as the cerium compound, one or more kinds of compounds selected from the group consisting of cerium nitrate salts and cerium sulfate salts are preferable, one or more kinds of compounds selected from the group consisting of ammonium cerium (IV) nitrate and ammonium cerium (IV) sulfate are more preferable, and ammonium cerium (IV) nitrate is even more preferable.

In view of further improving the transition metal-containing substance removal efficiency, the content of the cerium compound in the chemical solution with respect to the total mass of the chemical solution is preferably equal to or greater than 3% by mass, and more preferably equal to or greater than 5% by mass.

Furthermore, in view of further improving the properties of inhibiting cerium from remaining on the surface of the substrate (hereinafter, also simply referred to as "cerium retention inhibition properties"), the content of the cerium compound in the chemical solution with respect to the total mass of the chemical solution is preferably equal to or smaller than 40% by mass, and more preferably equal to or smaller than 30% by mass.

In view of further improving the balance between the transition metal-containing substance removal efficiency and the cerium retention inhibition properties, the content of the cerium compound in the chemical solution with respect to the total mass of the chemical solution is, for example, preferably 3% to 40% by mass and more preferably 5% to 30% by mass.

pH Adjuster

The chemical solution according to an embodiment of the present invention includes a pH adjuster. The pH adjuster included in the chemical solution is one or more pH adjusters selected from the group consisting of nitric acid, perchloric acid, ammonia, and sulfuric acid.

It is preferable that the pH adjuster includes nitric acid. In other words, it is preferable that the chemical solution according to the embodiment of the present invention includes nitric acid.

The preferable content of the pH adjuster also varies with the pH to be set, the type of the pH adjuster to be used, the content of the cerium compound in the chemical solution, and the like.

In addition, for example, in view of further improving the cerium retention inhibition properties, in a case where the pH adjuster is nitric acid, the content of the nitric acid in the chemical solution with respect to the total mass of the chemical solution is, for example, preferably equal to or greater than 0.5% by mass and more preferably equal to or greater than 1% by mass.

Likewise, in view of further improving the transition metal-containing substance removal efficiency, in a case where the pH adjuster is nitric acid, the content of the nitric acid in the chemical solution with respect to the total mass of the chemical solution is, for example, preferably equal to or smaller than 40% by mass and more preferably equal to or smaller than 30% by mass.

The content of the nitric acid mentioned herein means the content of $HNO_3$ with respect to the total mass of the chemical solution, regardless of the form of the nitric acid added to the chemical solution (for example, the nitric acid may be added in the form of pure nitric acid or in the form of an aqueous nitric acid solution).

Likewise, in a case where the pH adjuster is perchloric acid, the content of the perchloric acid in the chemical solution with respect to the total mass of the chemical solution is, for example, preferably equal to or greater than 0.5% by mass and more preferably equal to or greater than 1% by mass. In a case where the pH adjuster is perchloric acid, the content of the perchloric acid in the chemical solution with respect to the total mass of the chemical solution is, for example, preferably equal to or smaller than 20% by mass and more preferably equal to or smaller than 10% by mass. The content of the perchloric acid mentioned herein means the content of $HClO_4$ with respect to the total mass of the chemical solution, regardless of the form of the perchloric acid added to the chemical solution (for example, the perchloric acid may be added in the form of pure perchloric acid or in the form of an aqueous perchloric acid solution).

In a case where the pH adjuster is ammonia, the content thereof is calculated under the assumption that the ammonia is added to the chemical solution as 28% by mass aqueous ammonia. At this time, it is preferable that the ammonia is included in the chemical solution in such an amount that the content of the 28% by mass aqueous ammonia is, for example, equal to or greater than 0.5% by mass (more preferably equal to or greater than 1% by mass) with respect to the total mass of the chemical solution. Likewise, in a case where the pH adjuster is ammonia, the content thereof is a value calculated under the assumption that the ammonia is added to the chemical solution as 28% by mass aqueous ammonia. At this time, it is preferable that the ammonia is included in the chemical solution in such an amount that and the content of the 28% by mass aqueous ammonia is, for example, equal to or smaller than 20% by mass (more preferably equal to or smaller than 15% by mass) with respect to the total mass of the chemical solution. The form of the ammonia added to the chemical solution is not limited. The ammonia may be added in the form of aqueous ammonia. Alternatively, gaseous ammonia may be added by being dissolved in the chemical solution.

In a case where the pH adjuster is sulfuric acid, the content of the sulfuric acid in the chemical solution with respect to the total mass of the chemical solution is, for example, preferably equal to or greater than 1% by mass and more preferably equal to or greater than 5% by mass. In a case where the pH adjuster is sulfuric acid, the content of the sulfuric acid in the chemical solution with respect to the total mass of the chemical solution is, for example, preferably equal to or smaller than 25% by mass and more preferably equal to or smaller than 15% by mass. The content of the sulfuric acid mentioned herein means the content of $H_2SO_4$ with respect to the total mass of the chemical solution, regardless of the form of the sulfuric acid added to the chemical solution (for example, the sulfuric acid may be added in the form of pure sulfuric acid or in the form of an aqueous sulfuric acid solution).

Solvent

The chemical solution may include a solvent.

Examples of the solvent include water and an organic solvent. Among these, water is preferable.

Water may include a trace of components that are unavoidably mixed in. Particularly, water having undergone a purification treatment such as distilled water, deionized water, or ultrapure water is preferable, and ultrapure water used for manufacturing semiconductors is more preferable.

The concentration of water in the chemical solution is not particularly limited, but is preferably equal to or higher than 30% by mass. The upper limit thereof is not particularly limited, but is preferably equal to or lower than 99.9% by mass, and more preferably equal to or lower than 92% by mass.

The chemical solution according to the embodiment of the present invention may include other components in addition to the components described above.

Those other components are not particularly limited, and examples thereof include known components. Examples of the components include the surfactants described in paragraph "0026" of JP2014-093407A, paragraphs "0024" to "0027" of JP2013-055087A, paragraphs "0024" to "0027" of JP2013-012614A, and the like.

Examples thereof also include the additives (anticorrosive and the like) disclosed in paragraphs "0017" to "0038" of JP2014-107434A, paragraphs "0033" to "0047" of JP2014-103179A, paragraphs "0017" to "0049" of JP2014-093407A, and the like.

The pH of the chemical of the present invention is not particularly limited, but is equal to or lower than 10.0 in many cases.

Especially, the pH of the chemical solution is preferably less than 8.0, and more preferably −1.0 to 4.0.

That is, in a case where the chemical solution includes a pH adjuster, the content of the pH adjuster with respect to the total mass of the chemical solution is preferably set such that the pH of the chemical solution falls into the above range.

The method for manufacturing the chemical solution according to the embodiment of the present invention is not particularly limited, and examples thereof include a method of thoroughly mixing together predetermined raw materials by using a stirrer such as a mixer.

Examples of the manufacturing method include a method of adjusting the pH to a preset value and then performing mixing and a method of performing mixing and then adjusting the pH to a preset value. Furthermore, it is also possible to use a method of manufacturing a concentrated solution and then adjusting the concentration thereof to a predetermined value by diluting the solution at the time of use. In addition, the concentrated solution can be used after being diluted and then adjusted to a preset pH. Moreover, a preset amount of pure water for dilution can be added to the concentrated solution, or a predetermined amount of the concentrated solution can be added to pure water for dilution.

Object to be Treated

The chemical solution according to the embodiment of the present invention is used for removing a transition metal-containing substance on a substrate.

In the present specification, "on a substrate" includes, for example, all of the front and back, the lateral surfaces, and the inside of grooves of a substrate, and the like. The transition metal-containing substance on a substrate includes not only a transition metal-containing substance which directly contacts the surface of the substrate but also a transition metal-containing substance which is on the substrate through another layer.

Examples of the transition metal included in the transition metal-containing substance include a metal M selected from Ru (ruthenium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

That is, as the transition metal-containing substance, a substance including the metal M is preferable.

Particularly, the transition metal-containing substance is preferably a Ru-containing substance. That is, the chemical solution according to the embodiment of the present invention is more preferably used for removing the Ru-containing substance.

The content of Ru atoms in the Ru-containing substance with respect to the total mass of the Ru-containing substance is preferably equal to or greater than 10% by mass, more preferably equal to or greater than 30% by mass, and even more preferably equal to or greater than 50% by mass. The upper limit thereof is not particularly limited, but is 100% by mass for example.

The transition metal-containing substance only needs to be a substance including a transition metal (transition metal atoms), and examples thereof include a simple transition metal, an alloy including a transition metal, an oxide of a transition metal, a nitride of a transition metal, and an oxynitride of a transition metal. Among these, as the transition metal-containing substance, simple Ru, an alloy of Ru, an oxide of Ru, a nitride of Ru, or an oxynitride of Ru is preferable.

Furthermore, the transition metal-containing substance may be a mixture including two or more kinds of compounds among the above compounds.

The oxide, nitride, and oxynitride described above may be a composite oxide, a composite nitride, and a composite oxynitride including a transition metal.

The content of transition metal atoms in the transition metal-containing substance with respect to the total mass of the transition metal-containing substance is preferably equal to or greater than 10% by mass, more preferably equal to or greater than 30% by mass, and even more preferably equal to or greater than 50% by mass. The upper limit thereof is 100% by mass because the transition metal-containing substance may be a transition metal.

The object to be treated is a substrate having a transition metal-containing substance. That is, the object to be treated includes at least a substrate and a transition metal-containing substance on the substrate.

The type of the substrate is not particularly limited, but is preferably a semiconductor substrate.

Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The type of the transition metal-containing substance on the substrate is as described above.

The form of the transition metal-containing substance on the substrate is not particularly limited. For example, the transition metal-containing substance may be disposed in the form of a film (transition metal-containing film), in the form of wiring (transition metal-containing wiring), or in the form of particles. As described above, the transition metal is preferably Ru, and the object to be treated preferably has a substrate and a Ru-containing film, Ru-containing wiring, or a particle-like Ru-containing substance which is disposed on the substrate.

Examples of the substrate, on which the transition metal-containing substance is disposed in the form of particles, include a substrate obtained by performing dry etching on a substrate having a transition metal-containing film such that particle-like transition metal-containing substances are then attached to the substrate as residues as will be described later, and a substrate obtained by performing a chemical mechanical polishing (CMP) treatment on the transition metal-containing film such that particle-like transition metal-containing substances are then attached to the substrate as residues as will be described later.

The thickness of the transition metal-containing film is not particularly limited, and may be appropriately selected according to the use. For example, the thickness is preferably equal to or smaller than 50 nm, more preferably equal to or smaller than 20 nm, and even more preferably equal to or smaller than 10 nm.

The transition metal-containing film may be disposed only on one of the main surfaces of the substrate, or may be disposed on both the main surfaces of the substrate. Furthermore, the transition metal-containing film may be disposed on the entire main surface of the substrate, or may be disposed on a portion of the main surface of the substrate.

The substrate may have various layers and/or structures as desired in addition to the transition metal-containing substance. For example, the substrate may have metal wiring, a gate electrode, a source electrode, a drain electrode, an insulating layer, a ferromagnetic layer, and/or a non-magnetic layer, and the like.

The substrate may have the structure of an exposed integrated circuit, for example, an interconnection mechanism such as metal wiring and a dielectric material. Examples of metals and alloys used for the interconnect mechanism include aluminum, a copper-aluminum alloy, copper, titanium, tantalum, cobalt, silicon, titanium nitride, tantalum nitride, and tungsten. The substrate may have a layer of silicon oxide, silicon nitride, silicon carbide, and/or carbon-doped silicon oxide.

The size, thickness, shape, layer structure, and the like of the substrate are not particularly limited, and can be appropriately selected as desired.

As described above, the object to be treated used in the treatment method according to the embodiment of the present invention has a transition metal-containing substance on a substrate.

The method for manufacturing the substrate having the transition metal-containing substance is not particularly limited. For example, a transition metal-containing film can be formed on a substrate by a sputtering method, a chemical vapor deposition (CVD) method, a molecular beam epitaxy (MBE) method, or the like. In a case where the transition metal-containing film is formed by a sputtering method, a CVD method, or the like, sometimes the transition metal-containing substance is also attached to the back surface of the substrate having the transition metal-containing film (the surface opposite to the side of the transition metal-containing film).

Furthermore, transition metal-containing wiring may be formed on a substrate by performing the aforementioned method through a predetermined mask.

In addition, after the transition metal-containing film or the transition metal-containing wiring is formed on a substrate, the substrate may be further subjected to a different process or treatment and then used as the object to be treated by the treatment method of the present invention.

For example, by performing dry etching on a substrate having a transition metal-containing film or transition metal-containing wiring, a substrate having dry etching residues including a transition metal may be manufactured. Furthermore, by performing CMP on a substrate having a transition metal-containing film or transition metal-containing wiring, a substrate having a transition metal-containing substance may be manufactured.

Method of Applying Chemical Solution

The method of the present invention includes a step A of removing a transition metal-containing substance on a substrate by using the aforementioned chemical solution for an object to be treated (the substrate having the transition metal-containing substance).

As described above, particularly, in a case where the transition metal-containing substance includes a Ru-containing substance, the method according to the embodiment of the present invention is suitably used.

The chemical solution used in the step A is as described above.

In addition, the substrate having a transition metal-containing substance, which is an object to be treated by the step A, is as described above.

Examples of the specific method of the step A include a method of bringing the substrate having a transition metal-containing substance, which is an object to be treated, into contact with the chemical solution.

The method of bringing the substrate into contact with the chemical solution is not particularly limited, and examples thereof include a method of immersing the object to be treated in the chemical solution put in a tank, a method of spraying the chemical solution onto the substrate, a method of causing the chemical solution to flow on the substrate, and any combination of these. Among these, the method of immersing the substrate having a transition metal-containing substance, which is an object to be treated, in the chemical solution is preferable.

In order to further enhance the cleaning ability of the chemical solution, a mechanical stirring method may also be used.

Examples of the mechanical stirring method include a method of circulating the chemical solution on a substrate, a method of causing the chemical solution to flow on the substrate or spraying the chemical solution onto the substrate, a method of stirring the chemical solution by using ultrasonic or megasonic waves, and the like.

The treatment time of the step A can be adjusted according to the method of bringing the chemical solution into contact with the substrate, the temperature of the chemical solution, and the like. The treatment time (the contact time between the chemical solution and the object to be treated) is not particularly limited, but is preferably 0.25 to 10 minutes, and more preferably 0.5 to 2 minutes.

The temperature of the chemical solution during the treatment is not particularly limited. The lower limit of the temperature is preferably equal to or higher than 20° C., and more preferably equal to or higher than 35° C. The upper limit of the temperature is preferably equal to or lower than 75° C., and more preferably equal to or lower than 60° C.

Specifically, examples of suitable embodiments of the step A include a step A1 of performing a recess etching treatment on transition metal-containing wiring disposed on a substrate by using the chemical solution, a step A2 of removing a transition metal-containing film on outer edge portions of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, and a step A5 of removing a transition metal-containing substance on a substrate, which has undergone a chemical mechanical polishing treatment, by using the chemical solution.

Among these, as the step A, the step A2 or the step A3 is more preferable.

Hereinafter, the treatment method according to the embodiment of the present invention used in each of the above treatments will be described.

Step A1

Examples of the step A include a step A1 of performing a recess etching treatment on transition metal-containing wiring disposed on a substrate by using the chemical solution.

FIG. 1 is a schematic cross-sectional top view showing an example of a substrate having transition metal-containing wiring (hereinafter, referred to as "wiring substrate" as well) which is an object to be treated by the recess etching treatment in the step A1.

A wiring substrate 10a shown in FIG. 1 has a substrate not shown in the drawing, an insulating film 12 having a groove disposed on the substrate, a barrier metal layer 14 disposed along the inner wall of the groove, and transition metal-containing wiring 16 that fills up the inside of the groove.

The substrate and the transition metal-containing wiring in the wiring substrate are as described above.

As the transition metal-containing wiring, Ru-containing wiring (wiring including Ru) is preferable. It is preferable that the Ru-containing wiring includes simple Ru, an alloy of Ru, an oxide of Ru, a nitride of Ru, or an oxynitride of Ru.

The material constituting the barrier metal layer in the wiring substrate is not particularly limited, and examples thereof include TiN and TaN.

In FIG. 1, an embodiment is illustrated in which the wiring substrate has a barrier metal layer. However, the wiring substrate may not have the barrier metal layer.

The method for manufacturing the wiring substrate is not particularly limited, and examples thereof include a method including a step of forming an insulating film on a substrate, a step of forming a groove in the insulating film, a step of forming a barrier metal layer on the insulating film, a step of forming a transition metal-containing film that fills up the groove, and a step of performing a smoothing treatment on the transition metal-containing film.

In the step A1, by performing a recess etching treatment on the transition metal-containing wiring in the wiring substrate by using the aforementioned chemical solution, a portion of the transition metal-containing wiring can be removed, and a recess portion can be formed.

Figure 2:
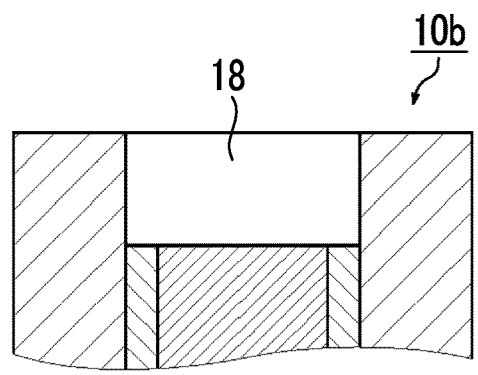
FIG. 2 is a schematic cross-sectional top view showing an example of an object to be treated having undergone the step A1.

More specifically, in a case where the step A1 is performed, as shown in the wiring substrate 10b in FIG. 2, a portion of the barrier metal layer 14 and the transition metal-containing wiring 16 is removed, and a recess portion 18 is formed.

Examples of the specific method of the step A1 include a method of bringing the wiring substrate into contact with the chemical solution.

The method of bringing the wiring substrate into contact with the chemical solution is as described above.

The suitable ranges of the contact time between the chemical solution and the wiring substrate and the temperature of the chemical solution are as described above.

After the step A1, if necessary, a step Ab of treating the substrate obtained by the step A1 by using a predetermined solution (hereinafter, referred to as "specific solution" as well) may be performed.

Particularly, as described above, in a case where the barrier metal layer is disposed on the substrate, the solubility in the chemical solution according to the embodiment of the present invention varies between the component constituting the transition metal-containing wiring and the component constituting the barrier metal layer depending on the type of the components. In this case, it is preferable to adjust the degree of solubility of the transition metal-containing wiring and the barrier metal layer by using a solution that dissolves better the barrier metal layer.

In this respect, as the specific solution, a solution is preferable which poorly dissolves the transition metal-containing wiring but excellently dissolves the substance constituting the barrier metal layer.

Examples of the specific solution include a solution selected from the group consisting of a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), and a mixed solution of hydrochloric acid and aqueous hydrogen peroxide (HPM).

The composition of FPM is, for example, preferably in a range of "hydrofluoric acid:aqueous hydrogen peroxide: water=1:1:1" to "hydrofluoric acid:aqueous hydrogen peroxide:water=1:1:200" (volume ratio).

The composition of SPM is, for example, preferably in a range of "sulfuric acid:aqueous hydrogen peroxide:water=3: 1:0" to "sulfuric acid:aqueous hydrogen peroxide:water=1: 1:10" (volume ratio).

The composition of APM is, for example, preferably in a range of "aqueous ammonia:aqueous hydrogen peroxide: water=1:1:1" to "aqueous ammonia:aqueous hydrogen peroxide:water=1:1:30" (volume ratio).

The composition of HPM is, for example, preferably in a range of "hydrochloric acid:aqueous hydrogen peroxide: water=1:1:1" to "hydrochloric acid:aqueous hydrogen peroxide:water=1:1:30" (volume ratio).

The preferred compositional ratio described above means a compositional ratio determined in a case where the content of hydrofluoric acid is 49% by mass, the content of sulfuric acid is 98% by mass, the content of aqueous ammonia is 28% by mass, the content of hydrochloric acid is 37% by mass, and the content of aqueous hydrogen peroxide is 31% by mass.

In the step Ab, as the method of treating the substrate obtained by the step A1 by using the specific solution, a method of bringing the substrate obtained by the step A1 into contact with the specific solution is preferable.

The method of bringing the substrate obtained by the step A1 into contact with the specific solution is not particularly limited, and examples thereof include the same method as the method of bringing the substrate into contact with the chemical solution.

The contact time between the specific solution and the substrate obtained by the step A1 is, for example, preferably 0.25 to 10 minutes, and more preferably 0.5 to 5 minutes.

The step A1 and the step Ab may be performed alternately.

In a case where the steps are performed alternately, it is preferable that each of the step A1 and the step Ab is performed 1 to 10 times.

Step A2

Examples of the step A include a step A2 of removing a transition metal-containing film at the outer edge portion of a substrate, on which the transition metal-containing film is disposed, by using the chemical solution.

Figure 3:
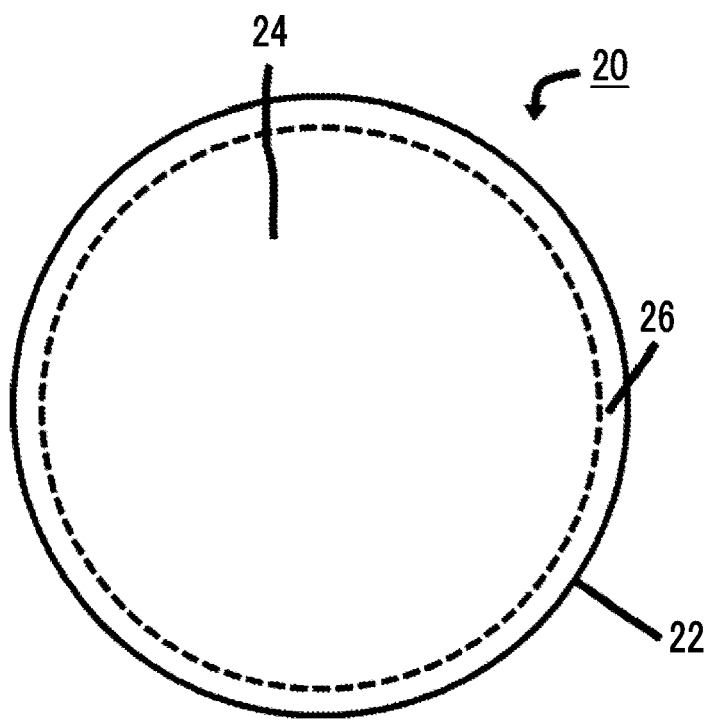
FIG. 3 is a schematic view showing an example of an object to be treated used in a step A2.

FIG. 3 is a schematic view (top view) showing an example of a substrate, on which a transition metal-containing film is disposed, as an object to be treated by the step A2.

An object 20 to be treated by the step A2 shown in FIG. 3 is a laminate having a substrate 22 and a transition metal-containing film 24 disposed on one main surface (entire region surrounded by the solid line) of the substrate 22. As will be described later, in step A2, the transition metal-containing film 24 positioned at an outer edge portion 26 (the region outside the broken line) of the object 20 to be treated is removed.

The substrate and the transition metal-containing film in the object to be treated are as described above.

As the transition metal-containing film, a Ru-containing film (film including Ru) is preferable. It is preferable that the Ru-containing film includes simple Ru, an alloy of Ru, an oxide of Ru, a nitride of Ru, or an oxynitride of Ru.

The specific method of the step A2 is not particularly limited, and examples thereof include a method of supplying the chemical solution from a nozzle such that the chemical solution contacts only the transition metal-containing film at the outer edge portion of the substrate.

At the time of performing the treatment of the step A2, it is possible to preferably use the substrate treatment device and the substrate treatment method described in JP-2010-267690A, JP2008-080288A, JP2006-100368A, and JP2002-299305A.

The method of bringing the object to be treated into contact with the chemical solution is as described above.

The suitable ranges of the contact time between the chemical solution and the object to be treated and the temperature of the chemical solution are as described above.

Step A3

Examples of the step A include a step A3 of removing a transition metal-containing substance attached to the back surface of a substrate, on which a transition metal-containing film is disposed, by using the chemical solution.

Examples of the object to be treated by the step A3 include the object to be treated used in the step A2. At the time of forming the object to be treated, which is constituted with a substrate and a transition metal-containing film disposed on one main surface of the substrate, used in the step A2, the transition metal-containing film is formed by sputtering, CVD, or the like. At this time, sometimes a transition metal-containing substance is attached to a surface (back surface) of the substrate that is opposite to the transition metal-containing film. The step A3 is performed to remove such a transition metal-containing substance in the object to be treated.

The specific method of the step A3 is not particularly limited, and examples thereof include a method of spraying the chemical solution such that the chemical solution contacts only the back surface of the substrate.

The method of bringing the object to be treated into contact with the chemical solution is as described above.

The suitable ranges of the contact time between the chemical solution and the object to be treated and the temperature of the chemical solution are as described above.

Step A4

Examples of the step A include a step A4 of removing a transition metal-containing substance on a substrate, which has undergone dry etching, by using the chemical solution.

Figure 4:
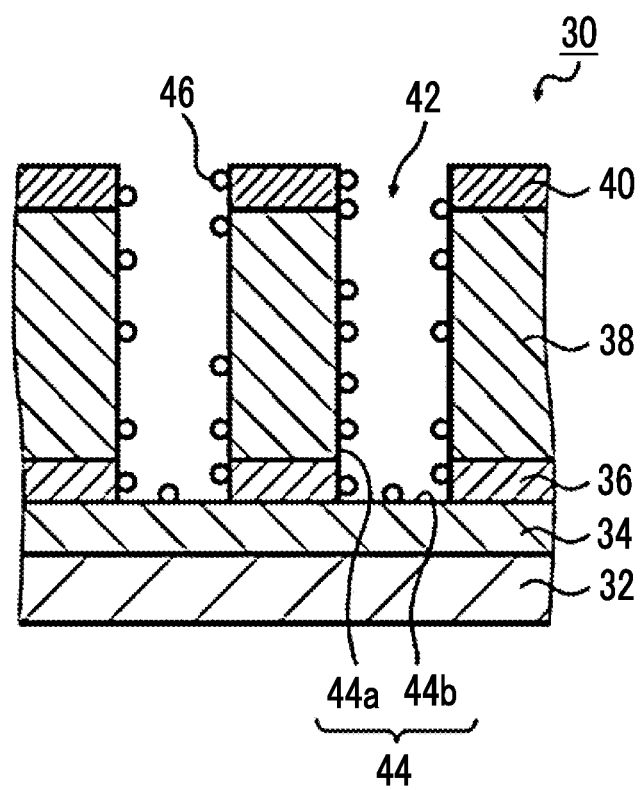
FIG. 4 is a schematic cross-sectional view showing an example of an object to be treated used in a step A4.

FIG. 4 is a schematic view showing an example of the object to be treated by the step A4.

An object 30 to be treated shown in FIG. 4 comprises a transition metal-containing film 34, an etch stop layer 36, an interlayer insulating film 38, a metal hard mask 40 in this order on a substrate 32. Through a dry etching process or the like, a hole 42 exposing the transition metal-containing film 34 is formed at a predetermined position. That is, the object to be treated shown in FIG. 4 is a laminate which comprises the substrate 32, the transition metal-containing film 34, the etch stop layer 36, the interlayer insulating film 38, and the metal hard mask 40 in this order and comprises the hole 42 that extends from the surface of the metal hard mask 40 to the surface of the transition metal-containing film 34 at the position of the opening portion of the mask 40. An inner wall 44 of the hole 42 is constituted with a cross-sectional wall 44a which includes the etch stop layer 36, the interlayer insulating film 38, and the metal hard mask 40, and a bottom wall 44b which includes the exposed transition metal-containing film 34. A dry etching residue 46 is attached to the inner wall 44.

The dry etching residue includes a transition metal-containing substance.

As the transition metal-containing film, a Ru-containing film (film including Ru) is preferable. It is preferable that the Ru-containing film includes simple Ru, an alloy of Ru, an oxide of Ru, a nitride of Ru, or an oxynitride of Ru.

As the transition metal-containing substance, a Ru-containing substance is preferable. It is preferable that the Ru-containing substance includes simple Ru, an alloy of Ru, an oxide of Ru, a nitride of Ru, or an oxynitride of Ru.

As the interlayer insulating film and the metal hard mask, known materials are selected.

Although FIG. 4 describes an embodiment in which a metal hard mask is used, a resist mask formed of a known photoresist material may also be used.

Examples of the specific method of the step A4 include a method of bringing the aforementioned object to be treated into contact with the chemical solution.

The method of bringing the wiring substrate into contact with the chemical solution is as described above.

The suitable ranges of the contact time between the chemical solution and the wiring substrate and the temperature of the chemical solution are as described above.

Step A5

Examples of the step A include a step A5 of removing a transition metal-containing substance on a substrate, which has undergone a chemical mechanical polishing (CMP), by using the chemical solution.

The CMP technique is used for smoothing an insulating film, smoothing connection holes, and a process of manufacturing damascene wiring and the like. In some cases, a substrate having undergone CMP is contaminated with a large amount of particles used as abrasive particles, metal impurities, and the like. Therefore, it is necessary to remove these contaminants and wash the substrate before the next processing stage starts. By performing the step A5, it is possible to remove a transition metal-containing substance which is generated in a case where the object to be treated by CMP has transition metal-containing wiring or a transition metal-containing film and attached onto the substrate.

As described above, examples of the object to be treated by the step A5 include a substrate having undergone CMP that has a transition metal-containing substance.

As the transition metal-containing substance, a Ru-containing substance is preferable. It is preferable that the Ru-containing substance includes simple Ru, an alloy of Ru, an oxide of Ru, a nitride of Ru, or an oxynitride of Ru.

Examples of the specific method of the step A5 include a method of bringing the aforementioned object to be treated into contact with the chemical solution.

The method of bringing the wiring substrate into contact with the chemical solution is as described above.

The suitable ranges of the contact time between the chemical solution and the wiring substrate and the temperature of the chemical solution are as described above.

Furthermore, the method according to the embodiment of the present invention preferably has a step C of measuring one or more items among the pH of the chemical solution in a tank including the chemical solution, the content of the cerium compound, and the content of the nitric acid and adjusting the formulation of the chemical solution by adding water, a cerium compound, or nitric acid according to the measured result, before, after, or during the step A.

It is preferable that the target range of the formulation adjusted in the step C is within a range that satisfies the preferable conditions of the chemical solution described above.

The content of the nitric acid and/or the cerium compound in the chemical solution is measured, for example, by ion chromatography. Specifically, examples of the device include Dionex ICS-2100 manufactured by Thermo Fisher Scientific Inc.

Step B

The step B included in the method according to the embodiment of the present invention is a step of performing a rinsing treatment on the substrate obtained by the step A by using a predetermined rinsing solution after the step A.

By removing the cerium derived from the chemical solution attached to the surface of the substrate by the step B, it is possible to avoid the adverse effect on the subsequent semiconductor device manufacturing process and/or the semiconductor device as a final product.

Rinsing Solution

Examples of the rinsing solution according to an embodiment of the present invention include one or more rinsing solutions selected from the group consisting of a solution including hydrogen peroxide and an acidic aqueous solution which is other than hydrofluoric acid, nitric acid, an aqueous perchloric acid solution, an aqueous oxalic acid solution, and a mixed aqueous solution of these (for example, a mixed aqueous solution of hydrofluoric acid and nitric acid) and does not include hydrogen peroxide.

As the solution including hydrogen peroxide, aqueous hydrogen peroxide, a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), or a mixed solution of hydrochloric acid and aqueous hydrogen peroxide (HPM) is preferable.

In the aqueous hydrogen peroxide, the content of $H_2O_2$ with respect to the total mass of the aqueous hydrogen peroxide is preferably 0.5% to 31% by mass, and more preferably 3% to 15% by mass.

Preferred conditions for FPM, SPM, APM, and HPM are, for example, the same as the preferred conditions for FPM, SPM, APM, and HPM used as the specific solution described above.

The acidic aqueous solution is a solution which is none of hydrofluoric acid, nitric acid, an aqueous perchloric acid solution, an aqueous oxalic acid solution, and a mixed aqueous solution of these and does not include hydrogen peroxide.

The mixed aqueous solution means an aqueous solution which substantially includes only a compound selected from the group consisting of hydrofluoric acid, nitric acid, perchloric acid, and oxalic acid as a component other than water ($H_2O$). For example, an aqueous solution including a compound, which is neither water nor a compound selected from the group consisting of hydrofluoric acid, nitric acid, perchloric acid, and oxalic acid, in an amount of equal to or greater than 0.01% by mass with respect to the total content of the above compound does not correspond to the mixed aqueous solution described above.

In other words, an aqueous solution including a compound, which is neither water nor a compound selected from the group consisting of hydrofluoric acid, nitric acid, perchloric acid, and oxalic acid, in an amount equal to or greater than 0.01% by mass (preferably equal to or greater than 1% by mass, more preferably equal to or greater than 10% by mass, and even more preferably equal to or greater than 30% by mass) with respect to the total content of the above compound and not including hydrogen peroxide can be used as a rinsing solution.

Herein, "does not include hydrogen peroxide" means that the acidic aqueous solution substantially does not include hydrogen peroxide. For example, "does not include hydrogen peroxide" refers to a case where the content of hydrogen peroxide with respect to the total mass of the acidic aqueous solution is equal to or smaller than 100 ppm by mass (preferably equal to or smaller than 1 ppm by mass).

The acidic aqueous solution is, for example, an aqueous solution having a pH less than 7.0. The pH of the acidic aqueous solution is preferably 0.0 to 4.0.

As the acidic aqueous solution, sulfuric acid (preferably 1% to 10% by mass sulfuric acid), phosphoric acid (preferably 0.1% to 20% by mass phosphoric acid, and more preferably 5% to 15% by mass phosphoric acid), aqueous carbon dioxide (preferably 10 ppm to 60 ppm by mass aqueous carbon dioxide), aqueous ozone (preferably 10 ppm to 60 ppm by mass aqueous ozone), aqueous hydrogen (preferably 10 ppm to 20 ppm by mass aqueous hydrogen), an aqueous citric acid solution (preferably a 0.01% to 10% by mass aqueous citric acid solution), an aqueous periodic acid solution (preferably 0.5% to 10% by mass aqueous periodic acid solution, examples of the periodic acid include orthoperiodic acid and metaperiodic acid), an aqueous hypochlorous acid solution (preferably a 1% to 10% by mass aqueous hypochlorous acid solution) or aqua regia (preferably aqua regia obtained by mixing together 37% by mass of hydrochloric acid:60% by mass of nitric acid at a volume ratio of 2.6:1.4 to 3.4:0.6) is preferable.

Each of the hydrofluoric acid, the nitric acid, the sulfuric acid, and the phosphoric acid means the corresponding compound in a liquid state. Each of these compounds may be an aqueous solution obtained by dissolving each of the chemical species in water.

The aqueous carbon dioxide, the aqueous ozone, and the aqueous hydrogen mean aqueous solutions obtained by dissolving $CO_2$, $O_3$, and $H_2$ in water respectively.

As long as the purpose of the rinsing step is not impaired, these rinsing solutions may be used by being mixed together.

Method of Applying Chemical Solution

Examples of the specific method of the step B include a method of bringing the substrate as an object to be treated obtained by the step A into contact with the rinsing solution.

The method of bringing the substrate into contact with the rinsing solution is performed by immersing the substrate in the rinsing solution put in a tank, spraying the rinsing solution onto the substrate, causing the rinsing solution to flow on the substrate, or any combination of these.

The treatment time (contact time between the rinsing solution and the object to be treated) is not particularly limited, but is 5 seconds to 5 minutes for example.

The temperature of the rinsing solution at the time of the treatment is not particularly limited. In a case where a mixed solution of sulfuric acid and aqueous hydrogen peroxide is used as the rinsing solution, the temperature thereof is preferably 90° C. to 250° C. In a case where one or more solutions selected from the solution including hydrogen peroxide other than SPM and the aforementioned acidic aqueous solution are used as the rinsing solution, the temperature thereof is preferably 15° C. to 70° C., and more preferably 20° C. to 60° C.

The rinsing treatment may be performed a plurality of times, and a plurality of kinds of rinsing solutions may be used.

If necessary, the method according to the embodiment of the present invention may have a step D of performing a drying treatment after the step B. The method of the drying treatment is not particularly limited, and examples thereof include spin drying, causing a drying gas to flow on the substrate, heating the substrate by a heating unit such as a hot plate or an infrared lamp, isopropyl alcohol (IPA) vapor drying, Marangoni drying, Rotagoni drying, and any combination of these.

The drying time varies with the specific method to be used, but is about 30 seconds to a few minutes in general.

The method according to the embodiment of the present invention may be performed in combination before or after other steps performed on a substrate. While being performed, the method according to the embodiment of the present invention may be incorporated into those other steps. Alternatively, while those other steps are being performed, the treatment method according to the embodiment of the present invention may be incorporated into the steps and performed.

Examples of those other steps include a step of forming each structure such as metal wiring, a gate structure, a source structure, a drain structure, an insulating layer, a ferromagnetic layer and/or a nonmagnetic layer (layer formation, etching, chemical mechanical polishing, modification, and the like), a step of forming resist, an exposure step and a removing step, a heat treatment step, a washing step, an inspection step, and the like.

The method according to the embodiment of the present invention may be performed in the back end process (BEOL: Back end of the line) or in the front end process (FEOL: Front end of the line). However, from the view point of enabling the effects of the present invention to be further demonstrated, it is preferable to perform the method in the front end process.

Method for Manufacturing Semiconductor Device

The present invention also includes a method for manufacturing a semiconductor device.

The method for manufacturing a semiconductor device according to an embodiment of the present invention is a method for manufacturing a semiconductor device including the method for treating a substrate described above.

Kit for Treating Substrate

The present invention also includes a kit for treating a substrate.

The kit for treating a substrate is a kit including a chemical solution, which is the chemical solution described above and uses ammonium cerium (IV) nitrate as a cerium compound, and the rinsing solution described above. It is preferable that the kit is used for the method for treating a substrate described above. It is preferable that the substrate treated using the kit for treating a substrate is used for manufacturing a semiconductor device.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not restricted by the following examples. Unless otherwise specified, the compounds and other materials used in examples are semiconductor grade materials.

Chemical Solution

Chemical solutions to be used in each test were prepared according to the formulations shown in the following Table 1.

The components used for preparing the chemical solutions described in Table 1 are as follows.

Cerium Compound

CAN: ammonium cerium (IV) nitrate (manufactured by Wako Pure Chemical Industries, Ltd.)
CAS: ammonium cerium (IV) sulfate (manufactured by Wako Pure Chemical Industries, Ltd.)

pH Adjuster

Nitric acid: 60% by mass nitric acid (manufactured by Wako Pure Chemical Industries, Ltd.)
Perchloric acid: 60% by mass aqueous perchloric acid solution (manufactured by Wako Pure Chemical Industries, Ltd.)
Ammonia: 28 mass % aqueous ammonia (manufactured by Wako Pure Chemical Industries, Ltd.)
Sulfuric acid: 95% by mass sulfuric acid (manufactured by Wako Pure Chemical Industries, Ltd.)
Water: ultrapure water Test Step A Substrates were prepared in which a ruthenium layer was formed on one surface of a substrate (silicon wafer (diameter: 12 inches)) by a chemical vapor deposition (CVD) method. The thickness of the ruthenium layer was 15 nm.

Each of the obtained substrates was put in a container filled with a chemical solution, and the chemical solution was stirred to perform a ruthenium layer removal treatment.

Step B

After the ruthenium layer on the substrate disappeared, the same substrate was placed in a container filled with a rinsing solution, and the rinsing solution was stirred for 0.5 minutes. The temperature of the rinsing solution was 25° C. Here, in a case where SPM was used as the rinsing solution, the temperature of the rinsing solution (SPM) was set to be 160° C.

Thereafter, the substrate was taken out of the rinsing solution, water was then immediately sprayed for 1 minute on the substrate at a flow rate of 1.5 L/min, and finally a nitrogen gas was sprayed on the substrate at a flow rate of 50 L/min.

Rinsing Solution

Table 1 shows the rinsing solution used in each of the examples or comparative examples.

In Table 1, the aqueous hydrogen peroxide, the phosphoric acid, the aqueous citric acid solution, the sulfuric acid, the aqueous orthoperiodic acid solution, the aqueous hypochlorous acid solution, and the hydrofluoric acid mean aqueous solutions obtained by dissolving the respective compounds in water such that the content of $H_2O_2$, $H_3PO_4$, citric acid, $H_2SO_4$, orthoperiodic acid, HClO, and HF with respect to the total mass of the rinsing solution becomes the value (mass percentage (% by mass)) described in the field of "Content".

The aqueous ozone, the aqueous carbon dioxide, and the aqueous hydrogen mean aqueous solutions obtained by dissolving ozone, $CO_2$, and $H_2$ in water in an amount of 50 ppm by mass, 30 ppm by mass, and 15 ppm by mass respectively.

SPM means a mixed solution obtained by mixing 98% by mass of sulfuric acid with 31% by mass of aqueous hydrogen peroxide at a volume ratio of 3:1.

FPM means a mixed solution obtained by mixing together 49% by mass of hydrofluoric acid, 31% by mass of aqueous hydrogen peroxide, and water at a volume ratio of 1:1:5.

APM means a mixed solution obtained by mixing together 28% by mass of aqueous ammonia, 31% by mass of aqueous hydrogen peroxide, and water at a volume ratio of 1:1:5.

HPM means a mixed solution obtained by mixing together 37% by mass of an aqueous hydrochloric acid solution, 31% by mass of aqueous hydrogen peroxide, and water at a volume ratio of 1:1:5.

The aqua regia means aqua regia obtained by mixing 37% by mass of hydrochloric acid with 60% by mass of nitric acid at a volume ratio of 3:1.

The rinsing solution used in Comparative Example 3 is an aqueous solution in which the content of hydrofluoric acid (HF) is 0.5% by mass with respect to the total mass of the solution and the content of nitric acid ($HNO_3$) is 5% by mass with respect to the total mass of the solution.

Evaluation

Removal Efficiency

The time taken for the ruthenium layer to disappear (time required for removal) was measured, and the dissolving ability of the chemical solution was evaluated based on the following standard.

The shorter the time required for removal, the higher the ruthenium removal efficiency.

A: Time required for removal≤30 seconds
B: 30 seconds<time required for removal≤60 seconds
C: 60 seconds<time required for removal Cerium Retention Inhibition Properties (Cerium Content)

For the dried substrate, the surface of the silicon wafer was measured by electron spectroscopy for chemical analysis (ESCA, device name: PHI Quantera SXM™), the cerium content (atom %) within the surface of the silicon wafer was calculated, and the cerium retention inhibition properties were evaluated. The smaller the cerium content, the better the cerium retention inhibition properties within the surface of the substrate.

The cerium content (atom %) is a percentage of the number of cerium atoms with respect to the total number of atoms in the measurement region.

The lower limit of the detection limit in the measurement method used herein is 0.1 atom %.

Result

Table 1 shows the results.

In Table 1, the field of "Treatment temperature" shows the temperature of the chemical solution used for tests.

In a case where nitric acid is used as a pH adjuster, the field of "Content" for "pH adjuster" shows the content (% by mass) of $HNO_3$ with respect to the total mass of the chemical solution. In a case where perchloric acid is used, the field of "Content" shows the content (% by mass) of $HClO_4$ with respect to the total mass of the chemical solution. In a case where ammonia is used, the field of "Content" shows the content (% by mass) of 28% by mass aqueous ammonia with respect to the total mass of the chemical solution. In a case where sulfuric acid is used, the field of "Content" shows the content (% by mass) of $H_2SO_4$ with respect to the total mass of the chemical solution.

The description of "undetected" in the field of "Cerium content" means that the cerium content was less than the lower limit (0.1 atom %) of the detection limit of the device.

TABLE 1

| | Chemical solution | | | | | | Treatment temperature (° C.) |
|---|---|---|---|---|---|---|---|
| | Formulation | | | | | | |
| | Cerium compound | | pH adjuster | | | | |
| | Type | Content (% by mass) | Type | Content (% by mass) | Water Content | pH | |
| Example 1 | CAN | 20 | Nitric acid | 10 | Balance | −0.4 | 50 |
| Example 2 | CAN | 25 | Nitric acid | 15 | Balance | −0.5 | 50 |
| Example 3 | CAN | 10 | Nitric acid | 15 | Balance | −0.3 | 50 |
| Example 4 | CAN | 10 | Nitric acid | 15 | Balance | −0.3 | 50 |
| Example 5 | CAN | 10 | Nitric acid | 15 | Balance | −0.3 | 50 |
| Example 6 | CAN | 10 | Nitric acid | 15 | Balance | −0.3 | 50 |
| Example 7 | CAN | 10 | Nitric acid | 15 | Balance | −0.3 | 50 |
| Example 8 | CAN | 10 | Nitric acid | 15 | Balance | −0.3 | 50 |
| Example 9 | CAN | 10 | Nitric acid | 15 | Balance | −0.3 | 50 |
| Example 10 | CAN | 10 | Nitric acid | 15 | Balance | −0.3 | 50 |
| Example 11 | CAN | 10 | Nitric acid | 15 | Balance | −0.3 | 50 |
| Example 12 | CAN | 10 | Nitric acid | 15 | Balance | −0.3 | 50 |
| Example 13 | CAN | 10 | Nitric acid | 15 | Balance | −0.3 | 50 |
| Example 14 | CAN | 10 | Nitric acid | 15 | Balance | −0.3 | 50 |
| Example 15 | CAN | 10 | Nitric acid | 15 | Balance | −0.3 | 50 |
| Example 16 | CAN | 10 | Nitric acid | 15 | Balance | −0.3 | 50 |
| Example 17 | CAN | 10 | Nitric acid | 15 | Balance | −0.3 | 50 |
| Example 18 | CAN | 10 | Nitric acid | 15 | Balance | −0.3 | 50 |
| Example 19 | CAN | 10 | Nitric acid | 15 | Balance | −0.3 | 50 |
| Example 20 | CAN | 10 | Nitric acid | 15 | Balance | −0.3 | 50 |
| Example 21 | CAN | 10 | Nitric acid | 15 | Balance | −0.3 | 50 |
| Example 22 | CAN | 10 | Perchloric acid | 5 | Balance | −0.2 | 50 |
| Example 23 | CAN | 10 | Ammonia | 5 | Balance | 2.5 | 50 |
| Example 24 | CAN | 10 | Ammonia | 10 | Balance | 4.0 | 50 |
| Example 25 | CAN | 35 | Nitric acid | 0.9 | Balance | −0.2 | 50 |
| Example 26 | CAN | 4.5 | Nitric acid | 32 | Balance | −0.6 | 50 |
| Example 27 | CAN | 35 | Nitric acid | 32 | Balance | −0.9 | 50 |
| Example 28 | CAN | 4.5 | Nitric acid | 0.9 | Balance | 0.3 | 50 |
| Example 29 | CAN | 35 | Nitric acid | 32 | Balance | −0.9 | 35 |
| Example 30 | CAN | 35 | Nitric acid | 32 | Balance | −0.9 | 22 |
| Example 31 | CAN | 10 | Nitric acid | 10 | Balance | −0.2 | 50 |
| Comparative Example 1 | CAN | 10 | Nitric acid | 15 | Balance | −0.3 | 50 |

TABLE 1-continued

| | | | | | | | |
|---|---|---|---|---|---|---|---|
| Comparative Example 2 | CAN | 30 | Nitric acid | 10 | Balance | −0.4 | 40 |
| Comparative Example 3 | CAN | 30 | Nitric acid | 10 | Balance | −0.4 | 40 |
| Comparative Example 4 | CAS | 20 | Nitric acid | 10 | Balance | −0.6 | 40 |

| | Rinsing solution | | Evaluation | |
|---|---|---|---|---|
| | Type | Content % by mass, ppm by mass, or volume ratio | Removal efficiency (Ru) | Cerium content (atom %) |
| Example 1 | Aqueous hydrogen peroxide | 5% by mass | B | Undetected |
| Example 2 | Aqueous hydrogen peroxide | 5% by mass | B | Undetected |
| Example 3 | Aqueous hydrogen peroxide | 5% by mass | B | Undetected |
| Example 4 | Aqueous hydrogen peroxide | 10% by mass | B | Undetected |
| Example 5 | Aqueous hydrogen peroxide | 3% by mass | B | Undetected |
| Example 6 | Aqueous hydrogen peroxide | 1% by mass | B | 0.4 |
| Example 7 | Phosphoric acid | 10% by mass | B | Undetected |
| Example 8 | Phosphoric acid | 5% by mass | B | Undetected |
| Example 9 | Phosphoric acid | 0.2% by mass | B | 0.4 |
| Example 10 | Aqueous citric acid solution | 5% by mass | B | 0.8 |
| Example 11 | Sulfuric acid | 5% by mass | B | 0.4 |
| Example 12 | SPM | 3:1 | B | Undetected |
| Example 13 | FPM | 1:1:5 | B | Undetected |
| Example 14 | APM | 1:1:5 | B | Undetected |
| Example 15 | HPM | 1:1:5 | B | Undetected |
| Example 16 | Aqueous ozone | 50 ppm by mass | B | 0.9 |
| Example 17 | Aqueous carbon dioxide | 30 ppm by mass | B | 0.5 |
| Example 18 | Aqueous hydrogen | 15 ppm by mass | B | 0.1 |
| Example 19 | Aqueous orthoperodic acid solution | 1% by mass | B | Undetected |
| Example 20 | Aqueous hypochlorous acid solution | 2% by mass | B | 0.6 |
| Example 21 | Aqua regia | 3:1 | B | Undetected |
| Example 22 | Aqueous hydrogen peroxide | 5% by mass | B | Undetected |
| Example 23 | Aqueous hydrogen peroxide | 5% by mass | B | Undetected |
| Example 24 | Aqueous hydrogen peroxide | 5% by mass | B | Undetected |
| Example 25 | Aqueous hydrogen peroxide | 5% by mass | A | 0.7 |
| Example 26 | Aqueous hydrogen peroxide | 5% by mass | A | Undetected |
| Example 27 | Aqueous hydrogen peroxide | 5% by mass | A | Undetected |
| Example 28 | Aqueous hydrogen peroxide | 5% by mass | B | Undetected |
| Example 29 | Aqueous hydrogen peroxide | 5% by mass | A | Undetected |
| Example 30 | Aqueous hydrogen peroxide | 5% by mass | B | Undetected |
| Example 31 | Aqueous hydrogen peroxide | 3% by mass | B | Undetected |
| Comparative Example 1 | Water | 100% by mass | B | 3.2 |
| Comparative Example 2 | Hydrofluoric acid | 0.5% by mass | B | 2.1 |
| Comparative Example 3 | 0.5% by mass of hydrofluoric acid/ 5% by mass of nitric acid | | B | 1.1 |
| Comparative Example 4 | Hydrofluoric acid | 0.5% by mass | B | 2.8 |

It has been confirmed that according to the method according to the embodiment of the present invention, it is possible to remove transition metal-containing substances on a substrate with high efficiency while inhibiting cerium from remaining on the surface of the treated substrate.

It has been confirmed that in a case where the content of sulfuric acid is equal to or greater than 1% by mass with respect to the total mass of the chemical solution, the cerium retention inhibition properties are further improved (comparison between Examples 25 and 27 and the like)

It has been confirmed that in a case where aqueous hydrogen peroxide in an amount equal to or greater than 3% by mass, phosphoric acid in an amount equal to or greater than 5% by mass, SPM, FPM, APM, HPM, an aqueous orthoperodic acid solution, or aqua regia is used as a rinsing solution, the cerium retention inhibition properties are further improved (the results of Examples 1 to 5, 7 to 8, 12 to 15, 19, 21, and the like).

It has been confirmed that in a case where the temperature of the chemical solution is 35° C. to 60° C., the removal efficiency is further improved (the results of Examples 27, 29, and 30).

Note that Comparative Examples 2 and 3 correspond to the test NO. 1 and the test No. 4 in Table 10 in Example 4 of JP4510979B respectively.

EXPLANATION OF REFERENCES

10a: wiring substrate not yet being subjected to recess etching treatment for wiring
10b: wiring substrate having undergone recess etching treatment for wiring
12: interlayer insulating film
14: barrier metal layer
16: transition metal-containing wiring
18: recess portion 20, 30: object to be treated
22: substrate
24: transition metal-containing film
26: outer edge portion
32: substrate
34: transition metal-containing film
36: etch stop layer
38: interlayer insulating film
40: metal hard mask
42: hole
44: inner wall
44a: cross-sectional wall
44b: bottom wall
46: dry etching residue

What is claimed is:

1. A method for treating a substrate, comprising:
a step A of removing a transition metal-containing substance on a substrate by using a chemical solution, which includes a cerium compound and one or more pH adjusters selected from the group consisting of nitric acid, perchloric acid, ammonia, and sulfuric acid, for the substrate having the transition metal-containing substance; and
a step B of performing a rinsing treatment on the substrate obtained by the step A by using one or more rinsing solutions selected from the group consisting of aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, a mixed solution of hydrochloric acid and aqueous hydrogen peroxide, sulfuric acid, phosphoric acid, aqueous carbon dioxide, aqueous ozone, aqueous hydrogen, an aqueous citric acid solution, an aqueous periodic acid solution, and an aqueous hypochlorous acid solution.

2. The method for treating a substrate according to claim 1,
wherein the cerium compound is one or more compounds selected from the group consisting of cerium nitrate salts and cerium sulfate salts.

3. The method for treating a substrate according to claim 1,
wherein the cerium compound is one or more compounds selected from the group consisting of ammonium cerium (IV) nitrate and ammonium cerium (IV) sulfate.

4. The method for treating a substrate according to claim 1,
wherein the cerium compound is ammonium cerium (IV) nitrate.

5. The method for treating a substrate according to claim 1,
wherein the pH of the chemical solution is −1.0 to 4.0.

6. The method for treating a substrate according to claim 1,
wherein the content of the cerium compound is equal to or greater than 5% by mass with respect to the total mass of the chemical solution.

7. The method for treating a substrate according to claim 1,
wherein the content of the cerium compound is equal to or smaller than 30% by mass with respect to the total mass of the chemical solution.

8. The method for treating a substrate according to claim 1,
wherein the pH adjuster includes nitric acid.

9. The method for treating a substrate according to claim 8,
wherein the content of the nitric acid is equal to or greater than 1% by mass with respect to the total mass of the chemical solution.

10. The method for treating a substrate according to claim 8,
wherein the content of the nitric acid is equal to or smaller than 30% by mass with respect to the total mass of the chemical solution.

11. The method for treating a substrate according to claim 1,
wherein the temperature of the chemical solution is equal to or higher than 35° C.

12. The method for treating a substrate according to claim 1,
wherein the temperature of the chemical solution is equal to or lower than 60° C.

13. The method for treating a substrate according to claim 1,
wherein the rinsing solution is a mixed solution of sulfuric acid and aqueous hydrogen peroxide that has a temperature of 90° C. to 250° C., or
one or more solutions that are selected from the group consisting of aqueous hydrogen peroxide, a mixed solution of hydrofluoric acid and aqueous hydrogen peroxide, a mixed solution of aqueous ammonia and aqueous hydrogen peroxide, a mixed solution of hydrochloric acid and aqueous hydrogen peroxide, sulfuric acid, phosphoric acid, aqueous carbon dioxide, aqueous ozone, aqueous hydrogen, an aqueous citric acid solution, an aqueous periodic acid solution, and an aqueous hypochlorous acid solution and have a temperature of 15° C. to 70° C.

14. The method for treating a substrate according to claim 1,
wherein the transition metal-containing substance includes at least one metal selected from the group consisting of Ru, Ti, Ta, Co, Cr, Hf, Os, Pt, Ni, Mn, Cu, Zr, Mo, La, W, and Ir.

15. The method for treating a substrate according to claim 14,
wherein the transition metal-containing substance includes a Ru-containing substance.

16. The method for treating a substrate according to claim 1,
wherein the step A is a step A1 of performing a recess etching treatment on transition metal-containing wiring disposed on a substrate by using the chemical solution, a step A2 of removing a transition metal-containing film at an outer edge portion of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, or a step A5 of removing a transition metal-containing substance on a substrate, which has undergone a chemical mechanical polishing treatment, by using the chemical solution.

17. The method for treating a substrate according to claim 16 that has the step A1 as the step A, further comprising:
a step Ab of treating the substrate obtained by the step A1 by using a solution selected from the group consisting of a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, and a mixed solution of hydrochloric acid and aqueous hydrogen peroxide after the step A1.

18. The method for treating a substrate according to claim 17,
wherein the step A1 and the step Ab are alternately repeated.

19. A method for manufacturing a semiconductor device, comprising:
the method for treating a substrate according to claim 1.

20. The method for treating a substrate according to claim 1,
wherein the transition metal-containing substance includes at least one metal selected from the group consisting of Ru, Ti, Ta, Co, Hf, Os, Pt, Ni, Mn, Cu, Zr, Mo, La, W, and Ir.

21. A method for treating a substrate, comprising:
a step A of removing a transition metal-containing substance on a substrate by using a chemical solution, which includes a cerium compound and one or more pH adjusters selected from the group consisting of nitric acid, perchloric acid, ammonia, and sulfuric acid, for the substrate having the transition metal-containing substance; and
a step B of performing a rinsing treatment on the substrate obtained by the step A by using one or more rinsing solutions selected from the group consisting of a solution including hydrogen peroxide and an acidic aqueous solution which is other than hydrofluoric acid, nitric acid, an aqueous perchloric acid solution, an aqueous oxalic acid solution, and a mixed aqueous solution of these and does not include hydrogen peroxide, and
wherein the transition metal-containing substance includes at least one metal selected from the group consisting of Ru, Ti, Ta, Co, Hf, Os, Pt, Ni, Mn, Cu, Zr, Mo, La, W, and Ir.

22. The method for treating a substrate according to claim 21,
wherein the transition metal-containing substance includes at least one metal selected from the group consisting of Ru and Os.

* * * * *